US012761283B2

(12) United States Patent
Aust et al.

(10) Patent No.: US 12,761,283 B2
(45) Date of Patent: Oct. 13, 2026

(54) METHOD AND CONTROL DEVICE FOR DETERMINING A MAXIMUM CURRENT LIMIT OF A BATTERY SYSTEM HAVING AT LEAST TWO BATTERIES

(71) Applicant: Volkswagen Aktiengesellschaft, Wolfsburg (DE)

(72) Inventors: Stefan Aust, Braunschweig (DE); Adam Hrazdira, Prague (CZ); Marian Vlcek, Prague (CZ); Jiri Valtr, Prague (CZ)

( * ) Notice: Subject to any disclaimer, the term of this patent is extended or adjusted under 35 U.S.C. 154(b) by 475 days.

(21) Appl. No.: 18/560,329

(22) PCT Filed: Mar. 10, 2022

(86) PCT No.: PCT/EP2022/056251
§ 371 (c)(1),
(2) Date: Nov. 10, 2023

(87) PCT Pub. No.: WO2022/242928
PCT Pub. Date: Nov. 24, 2022

(65) Prior Publication Data

US 2024/0288502 A1 Aug. 29, 2024

(30) Foreign Application Priority Data

May 20, 2021 (DE) ......................... 102021205161.8

(51) Int. Cl.
*G01R 31/385* (2019.01)
*G01R 31/389* (2019.01)
*H02J 7/62* (2026.01)

(52) U.S. Cl.
CPC ......... *G01R 31/385* (2019.01); *G01R 31/389* (2019.01); *H02J 7/62* (2026.01)

(58) Field of Classification Search
CPC ........ G01R 31/385; G01R 31/389; H02J 7/62
(Continued)

(56) References Cited

U.S. PATENT DOCUMENTS 5,311,112 A 5/1994 Creaco et al.
11,169,213 B2 * 11/2021 Karippumannil Prasad ............... G01R 31/367
(Continued)

FOREIGN PATENT DOCUMENTS

DE 102010027711 A1 1/2012
DE 102014210197 A1 12/2015
(Continued)

OTHER PUBLICATIONS

PCT/EP2022/056251, International Search Report (Jul. 5, 2022).
Priority German Application No. 102021205161.8 Examination Report (Mar. 24, 2022).

*Primary Examiner* — Aditya S Bhat
(74) *Attorney, Agent, or Firm* — Peter Zura; LOZA & LOZA, LLP

(57) ABSTRACT

Technologies and techniques for determining a maximum current limit of a battery system having at least two batteries. A separate current is measured at each of the at least two batteries, and a total current is measured of the battery system. For each of the measured separate currents, a current ratio is determined between the measured separate current in question and the measured total current. A maximum individual current limit of the battery system is determined for each of the at least two batteries on the basis of the determined current ratio in question and a nominal maximum current limit of the battery in question. The smallest determined maximum individual current limit is selected as a maximum current limit of the battery system and the determined maximum current limit is provided as a maximum current limit signal. Alternatively, or additionally, the measurements can also be carried out using resistances.

20 Claims, 3 Drawing Sheets

(58) Field of Classification Search
USPC .......................................................... 702/63
See application file for complete search history.

(56) References Cited

U.S. PATENT DOCUMENTS

| | | | |
|---|---|---|---|
| 2013/0319652 A1 | 12/2013 | Abicht et al. | |
| 2018/0321324 A1* | 11/2018 | Karippumannil Prasad ............... | G01R 31/367 |
| 2019/0081369 A1 | 3/2019 | Monden et al. | |
| 2019/0214837 A1 | 7/2019 | Kristjansson | |
| 2020/0259354 A1 | 8/2020 | Uchida et al. | |

FOREIGN PATENT DOCUMENTS

| | | |
|---|---|---|
| DE | 102017215647 A1 | 3/2019 |
| EP | 2765673 A1 | 8/2014 |

* cited by examiner

METHOD AND CONTROL DEVICE FOR DETERMINING A MAXIMUM CURRENT LIMIT OF A BATTERY SYSTEM HAVING AT LEAST TWO BATTERIES

RELATED APPLICATIONS

The present application claims priority to international Patent Application No. PCT/EP2022/056251 to Aust et al., filed Mar. 10, 2022, titled "Method And Control Device For Determining A Maximum Current Limit Of A Battery System Having At Least Two Batteries," which claims priority to German Pat. App. No. DE 10 2021 205 161.8, filed May 20, 2021, to Aust et al., the contents of each being incorporated by reference in their entirety herein.

TECHNICAL FIELD

The present disclosure relates to a method and to a control device for determining a maximum current limit of a battery system comprising at least two batteries. The present disclosure furthermore relates to a method and to a battery system control unit for controlling a battery system comprising at least two batteries.

BACKGROUND

In a battery system comprising several batteries connected in parallel, the individual batteries are generally not exactly identical and consequently also do not have the exact same electrical properties. The causes for this can be differences in production and differing aging behaviors. As a result, the distribution of current may also differ when identically constructed batteries are connected in parallel. In any case, individual current limits of the individual batteries must be adhered to during operation of the battery system.

SUMMARY

Aspects of the present disclosure are directed to a method and a control device for determining a maximum current limit of a battery system comprising at least two batteries, by way of which the maximum current limit of the battery system can be reliably determined.

Some aspects of the present disclosure are provided in the subject matters of the independent claims, found below. Other aspects are disclosed in the subject matter of the respectively associated dependent claims.

In some examples, a method is disclosed for determining a maximum current limit of a battery system comprising at least two batteries is made available, wherein the following measures are carried out:

- detecting a respective individual current at the at least two batteries;
- detecting a total current of the battery system;
- determining a respective current ratio of the detected individual currents to the detected total current;
- determining maximum individual current limits of the battery system for each of the at least two batteries, proceeding from the respective determined current ratio and a nominal maximum current limit of the respective battery;

and/or

- receiving or estimating a respective individual resistance of the at least two batteries;
- receiving or estimating a total resistance of the battery system;
- determining a respective resistance ratio of the received or estimated individual resistances to the received or estimated total resistance;
- determining maximum individual current limits of the battery system for each of the at least two batteries, proceeding from the respective determined resistance ratio and a nominal maximum current limit of the respective battery;
- selecting the smallest determined maximum individual current limit as the maximum current limit of the battery system; and providing the determined maximum current limit in the form of a maximum current limit signal.

In some examples, a control device is disclosed for determining a maximum current limit of a battery system comprising at least two batteries is created, wherein the control device is configured to carry out the following measures:

- receiving a respective individual current detected at the at least two batteries;
- receiving a detected total current of the battery system;
- determining a respective current ratio of the detected individual currents to the detected total current;
- determining maximum individual current limits of the battery system for each of the at least two batteries, proceeding from the respective determined current ratio and a nominal maximum current limit of the respective battery;

and/or

- receiving or estimating a respective individual resistance of the at least two batteries;
- receiving or estimating a total resistance of the battery system;
- determining a respective resistance ratio of the received or estimated individual resistances to the received or estimated total resistance;
- determining maximum individual current limits of the battery system for each of the at least two batteries, proceeding from the respective determined resistance ratio and a nominal maximum current limit of the respective battery;

selecting the smallest determined maximum individual current limit as the maximum current limit of the battery system; and providing the determined maximum current limit in the form of a maximum current limit signal.

Further features regarding embodiments relating to the control device will be apparent from the description of embodiments of the method. The advantages of the control device are in each case the same as for the embodiments of the method.

In some examples, a method for controlling a battery system comprising at least two batteries is also disclosed, wherein a method according to any one of the embodiments disclosed herein is carried out, and wherein a current of the battery system is limited, proceeding from the determined maximum current limit. This allows the total current of the battery system to be actively limited in accordance with the determined maximum current limit.

In some examples, a battery system control unit is disclosed, comprising at least one control device according to any one of the embodiments disclosed herein, wherein the battery system control unit is configured to limit a current of the battery system proceeding from a maximum current limit determined by means of the control device.

In some examples, the control device and the battery system control unit may be used in a vehicle, such as a motor vehicle. As a result, a vehicle is also provided as part of the present disclosure, comprising at least one control device according to any one of the described embodiments and/or comprising at least one battery system control unit.

Generally, however, the method and the battery system control unit can also be employed with other mobile or stationary battery systems.

DESCRIPTION OF THE DRAWINGS

Aspects of the present disclosure will be described in more detail hereafter based on preferred exemplary embodiments with reference to the figures. In the drawings.

DETAILED DESCRIPTION

Figure 1:
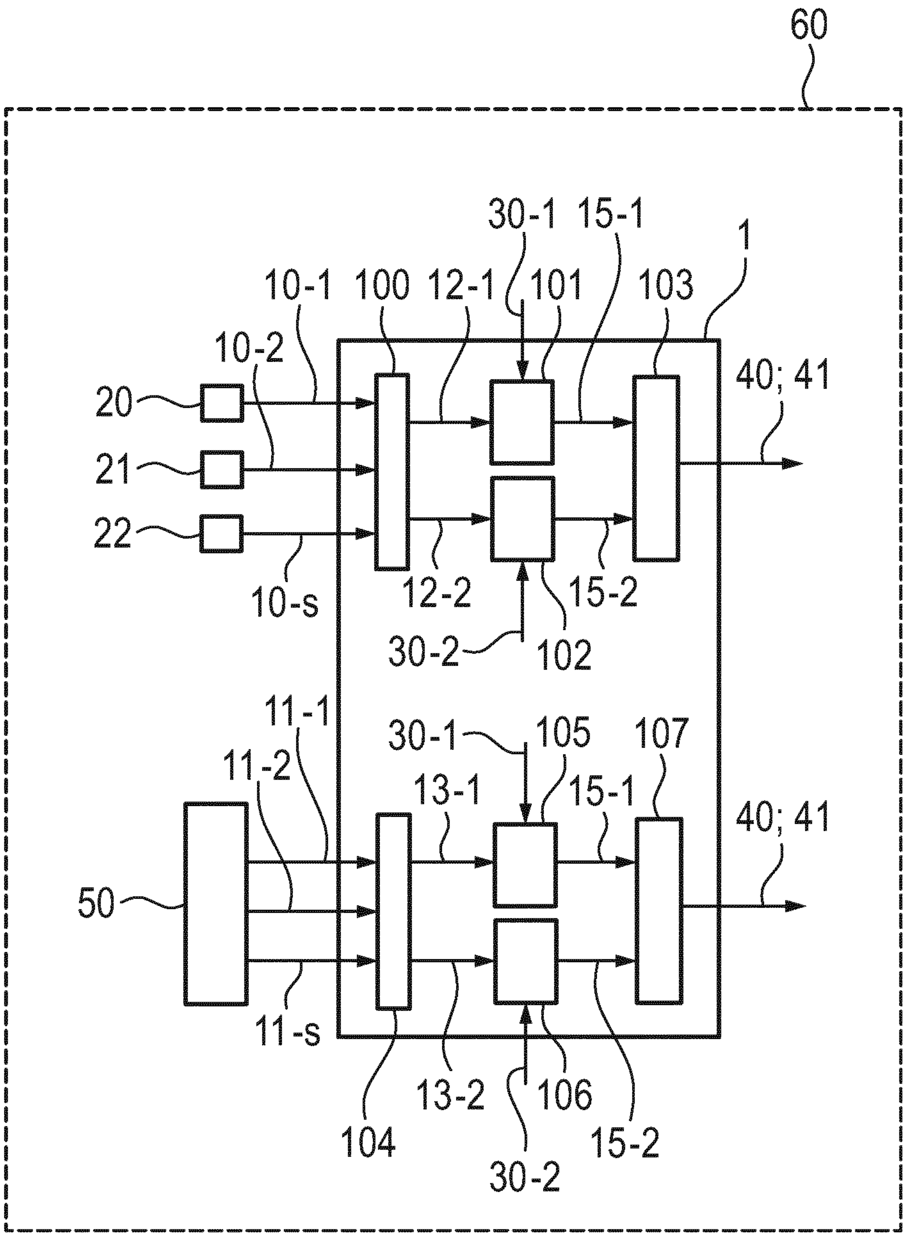
FIG. 1 shows a schematic representation of one embodiment of the control device for determining a maximum current limit of a battery system comprising at least two batteries, according to some aspects of the present disclosure.

The method and the control device disclosed herein make it possible to reliably determine a maximum current limit over an entire operating range of the battery system. In the process, two procedures may be employed in some examples. In the first procedure, a current ratio may be determined for each of the batteries from individual currents detected at the batteries and a total current detected at the battery system. Proceeding from the respective determined current ratio and a nominal maximum current limit, a maximum individual current limit of the battery system may be determined for each of the batteries. Of these, the smallest of the determined maximum individual current limits is selected. This is based on the idea that the "weakest" battery in terms of a maximum current defines a maximum possible total current of the battery system since the maximum current of this battery must not be exceeded.

In another procedure, as an alternative or in addition, resistance ratios may be determined in a similar manner and used to determine maximum individual current limits. The respective results can in particular also be summarized and combined with one another. The first procedure works particularly well with large currents, while the second procedure is advantageous with smaller currents, in which an error during the detection of the currents is greater so that a signal-to-noise ratio decreases.

In some examples, the batteries of the battery system are connected in parallel. An individual current can be detected at each of the batteries by means of a current sensor. Furthermore, a total current of the battery system is also detected, in particular by means of a current sensor. Each of the batteries has a predefined nominal maximum current limit.

Parts of the control device can, individually or together, be configured as a combination of hardware and software, for example as program code that is executed on a microcontroller or microprocessor. However, it may also be provided that parts, individually or together, are designed as an application-specific integrated circuit (ASIC) or a field-programmable gate array (FPGA).

The two procedures will be described hereafter by way of example. For this purpose, a battery system comprising two batteries connected in parallel shall be considered by way of example.

The following nominal maximum current limits are predefined, for example, for the batteries:

$$I_{1,max} = 150\ A$$

$$I_{2,max} = 150\ A$$

The detected individual currents and a total current are, for example:

$$I_{system} = 200\ A$$

$$I_1 = 110\ A$$

$$I_2 = 90\ A$$

This yields the following exemplary current ratios:

$$\text{Ratio}_{1,I} = I_{system}/I_1 = 200\ A/110\ A = 1.81$$

$$\text{Ratio}_{2,I} = I_{system}/I_2 = 200\ A/90\ A = 2.22$$

This yields the following maximum individual current limits:

$$I_{1,maxsystem,I} = Ratio_{1,I} \cdot I_{1,max} = 1.81 \cdot 150\ A = 271.5\ A$$

$$I_{2,maxsystem,}I = Ratio_{2,I} \cdot I_{2,max} = 2.22 \cdot 150\ A = 333\ A$$

Of these, the smallest determined maximum individual current limit is selected as the maximum current limit of the battery system:

$$I_{\max,system,I} = \text{min\_n}(I_{n,maxsystem,}1) = \min(I_{1,maxsystem,}1;\ I_{2,maxsystem,I}) = \min(271.5\ A,\ 333\ A) = 271.5\ A$$

In this example, the first battery would be considered the "weaker" battery in terms of a maximum current so that a total current of the battery system has to be limited, as a function of this battery, to a maximum current of 271.5 A to ensure that a nominal maximum current limit of this battery is not exceeded. Compared to a nominal maximum current limit of the battery system of 150 A+150 A=300 A, the determined maximum current limit is smaller. If a total current of 271.5 A, that is, up to the determined maximum current limit, were provided by the battery system, the first ("weaker") battery provides a current at its nominal maximum current limit of 150 A, while the second battery only provides 121.5 A.

In a second procedure, individual resistances of the two batteries and a total resistance are received, which have the following values, for example:

$$R_{system} = 50\ m\Omega$$

-continued $$R_1 = 90\ m\Omega$$

$$R_2 = 110\ m\Omega$$

The values can be estimated by a battery control unit, for example, using known methods, and provided by the same to the control device.

This yields the following exemplary resistance ratios:

$$\text{Ratio}_{1,R} = R_1/R_{system} = 90\ m\Omega/50\ m\Omega = 1.8$$

$$\text{Ratio}_{2,R} = R_2/R_{system} = 110\ m\Omega/50\ m\Omega = 2.2$$

This yields the following maximum individual current limits:

$$I_{1,maxsystem,R} = Ratio_{1,R} \cdot I_{1,max} = 1.8 \cdot 150\ A = 270\ A$$

$$I_{2,maxsystem,R} = Ratio_{2,R} \cdot I_{2,max} = 2.2 \cdot 150\ A = 330\ A$$

Of these, the smallest determined maximum individual current limit is selected as the maximum current limit of the battery system:

$$I_{\max,system,R} = \min\_n(I_{n,maxsystem,R}) = \min(I_{1,maxsystem,R}; I_{2,maxsystem,R}) = \min(270\ A, 330\ A) = 270\ A$$

The results of the first procedure and of the second procedure are thus almost identical. The examples are intended to illustrate aspects of the present disclosure. Generally, the values may also differ. In some examples, the battery system can also include more than two batteries. However, the basic procedure is also the same for more than two batteries.

In some examples, a weighted mean value of the respective current ratio and resistance ratio is determined, wherein the maximum individual current limits are determined proceeding from the respective weighted mean value. In other words, the current ratio and the resistance ratio are combined by a weighted mean value determination, which can also be carried out in the form of an interpolation between the two ratios. This may be carried out for each battery before the maximum individual current limits are determined. In this way, in particular, required computing power can be saved. The weighting factors allow a parameterization of the mean value determination or of the interpolation. The weighting factors can, for example, be empirically determined for different load scenarios and be kept available.

To come back to the above example, the following result may be obtained with a weighting factor w for each battery:

$$\text{Ratio}_{n,weighted} = w \cdot \text{Ratio}_{n,I} + (1 - w) \cdot \text{Ratio}_{n,R}$$

In some examples, weighting factors may be selected during the determination of the weighted mean value as a function of the total current. In this way, different weighting factors can be selected for different ranges of the total current. It may be provided that the weighting factors are determined as a function of the total current. In particular, it is provided that the weighting factors are selected in such a way that a proportion of the resistance ratio prevails in the lower range of the total current, while a proportion of the current ratio prevails in the upper range of the total current. This allows errors to be reduced which occur during the detection of the currents due to a signal-to-noise ratio being poorer at small currents. Overall, this improves the determination of the maximum current limit.

In one embodiment, the current ratios and/or resistance ratios and/or weighted mean values may be temporally filtered by means of a low-pass filter, wherein the maximum individual current limits are determined proceeding from the filtered ratios and/or filtered weighted mean values. In this way, a temporal progression of the current ratios and/or resistance ratios can be smoothed.

To return back to the example provided above, the following result may be obtained for the weighted mean values:

$$\text{Ratio}_{n,weighted,smoothed} = \text{low pass } (\text{Ratio}_{n,weighted}, \tau)$$

where τ is a smoothing coefficient according to the respective implementation of the low-pass filter.

Turning to FIG. 1, the drawing shows a schematic representation of one embodiment of the control device 1 for determining a maximum current limit 40 of a battery system comprising two batteries. The control device 1 may be configured to carry out the methods described in the present disclosure, based on the control device 1.

In this example, the control device 1 comprises the modules 100 to 103. The modules 100 to 103 can be configured as a combination of hardware and software, for example as program code that is executed on a microcontroller or microprocessor.

In this example, control device 1 is supplied with individual currents 10-1, 10-2 detected in each case at batteries of the battery system and a total current **10-*s* of the battery system. The currents 10-*x* are detected by means of current sensors 20, 21, 22** and are provided, for example, in the form of current signals.

In the module 100, the control device 1 determines a respective current ratio 12-1, 12-2 of the detected individual currents 10-1, 10-2 to the detected total current **10-*s***.

In the modules 101 and 102, the control device 1 determines the maximum individual current limits 15-1, 15-2 of the battery system for each of the two batteries, proceeding from the respective determined current ratio 12-1, 12-2 and a nominal maximum current limit 30-1, 30-2 of the respective battery.

In the module 103, the control device 1 selects the smallest determined maximum individual current limit as the maximum current limit 40 of the battery system and provides this in the form of a maximum current limit signal 41.

As an alternative or in addition, it may be provided that the control device 1 comprises the modules 104-107.

As an alternative or in addition, the control device 1 can then be supplied with respective (present) individual resistances 11-1, 11-2 of the two batteries of the battery system and a (present) total resistance **11-*s* of the battery system. The resistances 11-1, 11-2, 11-*s* can, for example, be provided and transmitted by a battery control unit 50**, or be estimated in another manner.

In the module 104, the control device 1 determines a respective resistance ratio 13-1, 13-2 ratio the received or estimated individual resistances 11-1, 11-2 to the received or estimated total resistance 11-*s*.

In the modules 105 and 106, the control device 1 determines the maximum individual current limits 15-1, 15-2 of the battery system for each of the two batteries, proceeding from the respective determined resistance ratio 13-1, 13-2 and the nominal maximum current limit 30-1, 30-2 of the respective battery.

In the module 107, the control device 1 selects the smallest determined maximum individual current limit as the maximum current limit 40 of the battery system and provides this in the form of a maximum current limit signal 41.

The results supplied by the modules 103 and 107 can also be combined.

The control device 1 can be part of a battery system control unit 60, wherein the battery system control unit 60 is configured to limit a current 10-*s* of the battery system proceeding from the maximum current limit 40 determined by means of the control device 1. For this purpose, in particular the maximum current limit signal 41 is evaluated and used in the battery system control unit 60.

Figure 2:
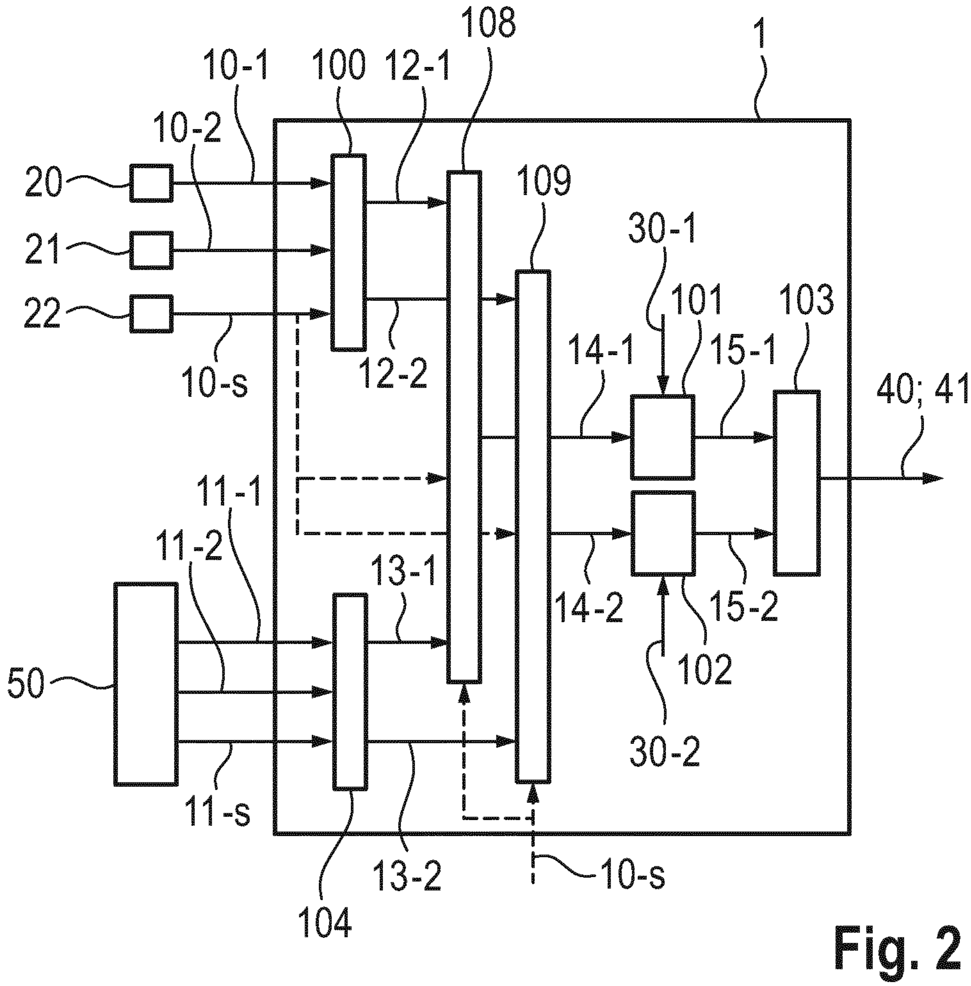
FIG. 2 shows a schematic representation of another embodiment of the control device, according to some aspects of the present disclosure.

FIG. 2 shows another embodiment of the control device 1. The embodiment is generally configured in the same manner as the embodiment shown in FIG. 1. Identical reference numerals denote identical features and terms.

In addition, the example of FIG. 2 may be configured such that a weighted mean value 14-1, 14-2 of the respective current ratio 12-1, 12-2 and resistance ratio 13-1, 13-2 is determined, wherein the maximum individual current limits 15-1, 15-2 are determined proceeding from the respective weighted mean value 14-1, 14-2. For this purpose, the control device 1 additionally comprises the modules 108 and 109, which carry out the weighted averaging by interpolation between the respective current ratio 12-1, 12-2 and the respective resistance ratio 13-1, 13-2.

It may be provided that weighting factors are selected during the determination of the weighted mean value 14-1, 14-2 in the modules 108 and 109 depending on the total current 10-*s*, and in particular as a function of the total current 10-*s*.

Figure 3:
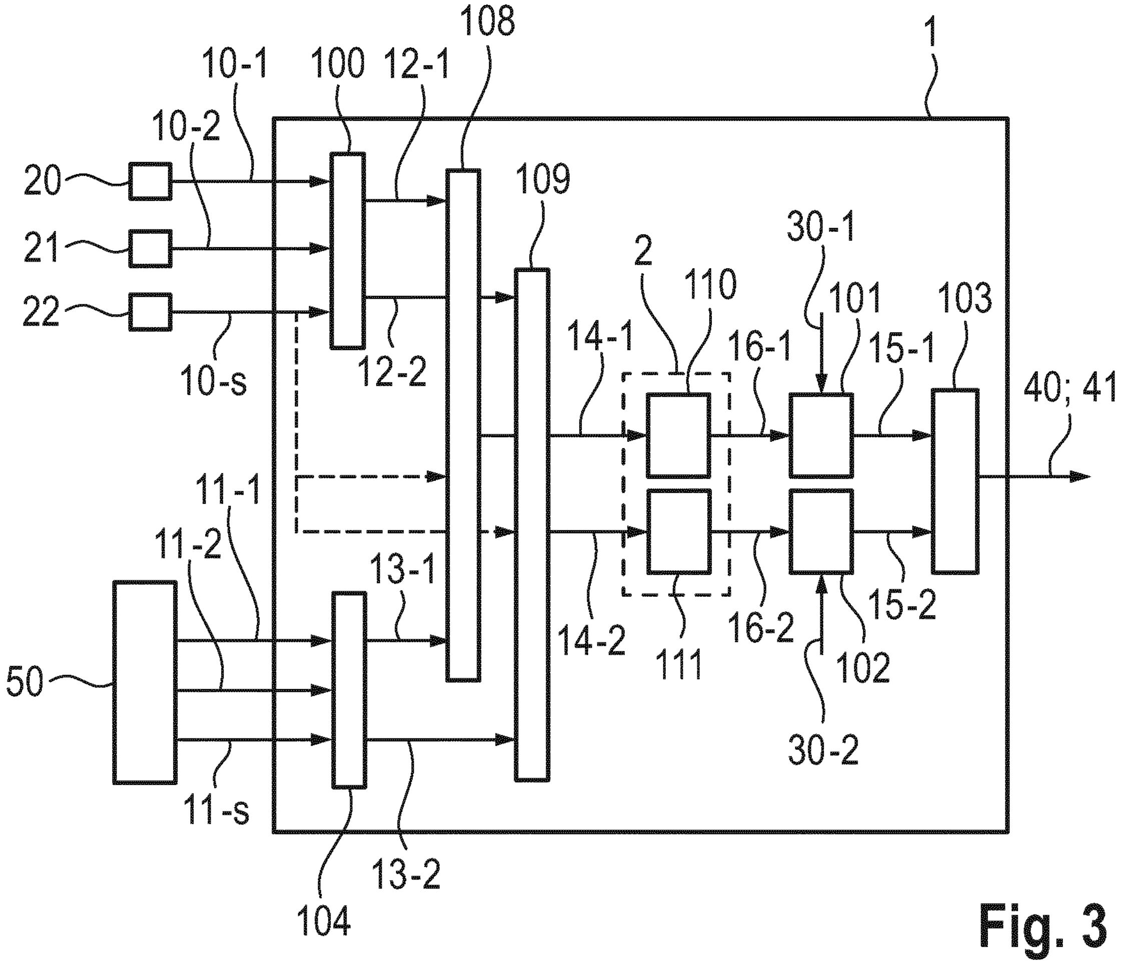
FIG. 3 shows a schematic representation of another embodiment of the control device, according to some aspects of the present disclosure.

FIG. 3 shows another embodiment of the control device 1. The embodiment is generally configured in the same manner as the embodiment shown in FIG. 2. Identical reference numerals denote identical features and terms.

In addition, it is provided that the weighted mean values 14-1, 14-2 are temporally filtered in the modules 110 and 111 by means of a low-pass filter, wherein the maximum individual current limits 15-1, 15-2 are determined proceeding from the filtered weighted mean values 16-1, 16-2. The modules 110 and 111 in particular form a filter device 2.

As an alternative, it is also possible to filter already the ratios 12-1, 12-2, 13-1, 13-2 by means of the low-pass filter (not shown), wherein the filtering of the weighted mean values 14-1, 14-2 is advantageous with respect to required hardware and/or required computing power.

LIST OF REFERENCE NUMERALS

1 control device
2 filter device
10-1 individual current
10-2 individual current
10-*s* total current
11-1 individual resistance
11-2 individual resistance
11-*s* total resistance
12-1 current ratio
12-2 current ratio
13-1 resistance ratio
13-2 resistance ratio
14-1 weighted mean value
14-2 weighted mean value
15-1 maximum individual current limit
15-2 maximum individual current limit
16-1 filtered weighted mean value
16-2 filtered weighted mean value
20 current sensor
21 current sensor
22 current sensor
30-1 nominal maximum current limit
30-2 nominal maximum current limit
40 maximum current limit
41 maximum current limit signal
50 battery control unit
60 battery system control unit
100-111 modules of the control device

The invention claimed is:

1. A method for operating a battery system control unit based on a maximum current limit of a battery system comprising at least two batteries, comprising:

(i) detecting a respective individual current for each of the at least two batteries;
detecting a total current of the battery system;
determining a respective current ratio based on the detected individual currents and the detected total current;
determining a maximum individual current limits for each of the at least two batteries, proceeding from the respective determined current ratio and a nominal maximum current limit of the respective battery;

and/or (ii) receiving or estimating a respective individual resistance of the at least two batteries;
receiving or estimating a total resistance of the battery system;
determining a respective resistance ratio based on the received or estimated individual resistances and the received or estimated total resistance;
determining a maximum individual current limits for each of the at least two batteries, proceeding from the respective determined resistance ratio and a nominal maximum current limit of the respective battery;

selecting the smallest determined maximum individual current limit as the maximum current limit of the battery system; and generating a maximum current limit signal based on the determined maximum current limit and utilizing the maximum current limit signal to actively restrict physical current output within the battery system.

2. The method according to claim 1, further comprising determining a weighted mean value of the respective current ratio and the resistance ratio.

3. The method according to claim 2, wherein the maximum individual current limits are determined from the weighted mean value of the respective current ratio and the resistance ratio.

4. The method according to claim 2, further comprising selecting weighting factors during the determination of the weighted mean value as a function of the total current.

5. The method according to claim 1, further comprising filtering one or more of (i) the current ratios, (ii) resistance ratios and/or (iii) weighted mean values via a low-pass filter.

6. The method according to claim 5, wherein determining the maximum individual current limits comprises determining the maximum individual current limits based on the filtered ratios and/or filtered weighted mean values.

7. The method according to claim 1, wherein the modified operation of the battery system control unit comprises limiting a total current of the battery system based on the maximum current limit signal.

8. An apparatus for controlling a battery system comprising at least two batteries, comprising:

a control device operatively coupled to the battery system; and a plurality of control modules, operatively coupled to the control device, wherein the control device and plurality of modules are configured to (i) detect a respective individual current for each of the at least two batteries;

detect a total current of the battery system;

determine a respective current ratio based on the detected individual currents and the detected total current;

determine a maximum individual current limits for each of the at least two batteries, proceeding from the respective determined current ratio and a nominal maximum current limit of the respective battery;

and/or (ii) receive or estimate a respective individual resistance of the at least two batteries;

receive or estimate a total resistance of the battery system;

determine a respective resistance ratio based on the received or estimated individual resistances and the received or estimated total resistance;

determine a maximum individual current limits for each of the at least two batteries, proceeding from the respective determined resistance ratio and a nominal maximum current limit of the respective battery;

select the smallest determined maximum individual current limit as the maximum current limit of the battery system; and generate a maximum current limit signal based on the determined maximum current limit and utilizing the maximum current limit signal to actively restrict physical current output within the battery system.

9. The apparatus according to claim 8, wherein the control device and plurality of modules are configured to determine a weighted mean value of the respective current ratio and the resistance ratio.

10. The apparatus according to claim 9, wherein the maximum individual current limits are determined from the weighted mean value of the respective current ratio and the resistance ratio.

11. The apparatus according to claim 9, wherein the control device and plurality of modules are configured to select weighting factors during the determination of the weighted mean value as a function of the total current.

12. The apparatus according to claim 8, wherein the control device and plurality of modules are configured to filter one or more of (i) the current ratios, (ii) resistance ratios and/or (iii) weighted mean values via a low-pass filter.

13. The apparatus according to claim 12, wherein the control device and plurality of modules are configured to determine the maximum individual current limits based on the filtered ratios and/or filtered weighted mean values.

14. The apparatus according to claim 8, wherein the modified operation of the battery system comprises limiting a total current of the battery system based on the maximum current limit signal.

15. A battery system control unit for controlling a battery system comprising at least two batteries, comprising:

a control device operatively coupled to the battery system; and a plurality of control modules, operatively coupled to the control device, wherein the control device and plurality of modules are configured to (i) detect a respective individual current for each of the at least two batteries;

detect a total current of the battery system;

determine a respective current ratio based on the detected individual currents and the detected total current;

determine a maximum individual current limits for each of the at least two batteries, proceeding from the respective determined current ratio and a nominal maximum current limit of the respective battery;

and/or (ii) receive or estimate a respective individual resistance of the at least two batteries;

receive or estimate a total resistance of the battery system;

determine a respective resistance ratio based on the received or estimated individual resistances and the received or estimated total resistance;

determine a maximum individual current limits for each of the at least two batteries, proceeding from the respective determined resistance ratio and a nominal maximum current limit of the respective battery;

select the smallest determined maximum individual current limit as the maximum current limit of the battery system; and generate a maximum current limit signal based on the determined maximum current limit and utilize the maximum current limit signal to actively restrict physical current output within the battery system.

16. The battery system control unit according to claim 15, wherein the control device and plurality of modules are configured to determine a weighted mean value of the respective current ratio and the resistance ratio.

17. The battery system control unit according to claim 16, wherein the maximum individual current limits are determined from the weighted mean value of the respective current ratio and the resistance ratio.

18. The battery system control unit according to claim 16, wherein the control device and plurality of modules are configured to select weighting factors during the determination of the weighted mean value as a function of the total current.

19. The battery system control unit according to claim 15, wherein the control device and plurality of modules are configured to filter one or more of (i) the current ratios, (ii) resistance ratios and/or (iii) weighted mean values via a low-pass filter.

20. The battery system control unit according to claim 19, wherein the control device and plurality of modules are configured to determine the maximum individual current limits based on the filtered ratios and/or filtered weighted mean values.

* * * * *